(12) United States Patent
Endo et al.

(10) Patent No.: US 7,622,757 B2
(45) Date of Patent: Nov. 24, 2009

(54) SEMICONDUCTOR DEVICE HAVING MULTIPLE WIRING LAYERS

(75) Inventors: Koichi Endo, Tokyo (JP); Yasuto Sumi, Kawasaki (JP); Katsuyuki Adachi, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/415,115

(22) Filed: May 2, 2006

(65) Prior Publication Data

US 2006/0264034 A1    Nov. 23, 2006

(30) Foreign Application Priority Data

May 18, 2005    (JP) ............... 2005-145030

(51) Int. Cl.
*H01L 27/10* (2006.01)
*H01L 23/48* (2006.01)

(52) U.S. Cl. .............. 257/211; 257/208; 257/773

(58) Field of Classification Search ............. 257/202, 257/204, 206–208, 210, 211, 401, E23.143, 257/E23.145, E23.146, 758, 773, 775, 776
See application file for complete search history.

(56) References Cited

U.S. PATENT DOCUMENTS 5,625,207 A * 4/1997 Trolle et al. ............. 257/207
6,445,071 B1 9/2002 Haruhana et al.
2002/0149962 A1 10/2002 Horiguchi

FOREIGN PATENT DOCUMENTS

| JP | 05-152525 | 6/1993 |
| JP | 07-142729 | 6/1995 |
| JP | 8-46049 | 2/1996 |
| JP | 08-125176 | 5/1996 |
| JP | 2003-151982 | 5/2003 |

* cited by examiner

*Primary Examiner*—Hung Vu
(74) *Attorney, Agent, or Firm*—Oblon, Spivak, McClelland, Maier & Neustadt, P.C.

(57) ABSTRACT

A semiconductor device comprises a plurality of semiconductor elements; and a first wire and a second wire provided to connect the semiconductor elements in parallel. The first wire and the second wire include respective wires formed in multiple wiring layers. Each wiring layer includes the first wire and the second wire formed alternately and in parallel. The wires are formed as to intersect each other in adjacent wiring layers. The first wires are connected with each other through a via-connection at an intersection of the first wires and the second wires are connected with each other through a via-connection at an intersection of the second wires.

19 Claims, 5 Drawing Sheets

SEMICONDUCTOR DEVICE HAVING MULTIPLE WIRING LAYERS

CROSS REFERENCE TO RELATED APPLICATION

This application is based on and claims the benefit of priority from prior Japanese Patent Application No. 2005-145030, filed on May 18, 2005, the entire contents of which are incorporated herein by reference.

BACKGROUND OF THE INVENTION

1. Field of the Invention

The present invention relates to a semiconductor device comprising a plurality of semiconductor elements connected in parallel, and wires connected to these semiconductor elements, which take the form of multi-layered wires.

2. Description of the Related Art

A semiconductor element, typically a MOSFET, comprises a semiconductor substrate 1 as shown in FIG. 8, in which impurity-diffused layers 2, 3 are formed as a source and a drain. On an insulator 4 above the semiconductor substrate 1, a gate electrode 5 is formed across both the diffused layers 2, 3. The diffused layers 2, 3 are connected to other elements through a first wire 6 and a second wire 7, respectively. Generally, the source and drain wires 6, 7 are required to allow for a larger current flow therein than in the gage wire and accordingly use a metal such as Al and Cu as wiring material in general.

The semiconductor device of such the type has no particular problem if the current flowing in the source and drain has a value as relatively small as several mA or below. In contrast, if the current flowing in the semiconductor device has a value of several 10 mA or several 100 mA, the current capacity limit per element requires the use of a structure having a plurality of elements connected in parallel. A length L in the wire stretching direction as shown in FIG. 9 denotes an effective length of the elements which are connected to one wire. An enhancement of the current capacity setting in the semiconductor device requires an increase in the number of elements connected in parallel and an extension of the length L. A problem arises herein about the maximum allowable current density in the wire. In leads from the wires 6, 7 to outside the element, or connections X with common wires 8, 9, current flows by (current per unit length)×L. Therefore, the length L elevates the possibility of the current density that exceeds the maximum allowable current density at the leads X from the wires 6, 7 to outside the element. When the current density exceeds the maximum allowable current density, electrons flowing through the wire collide with component atoms of wire material at an elevated frequency. This may possibly cause an electro-migration failure that breaks the wire. A wider wire width can increase the limit current per wire though it results in an increase in element area undesirably.

On the other hand, a wire may take the form of multi-layered wires. In addition, a wiring layer, in which a large current flows, may adopt a two-layered structure of a Cu wiring layer and an Al wiring layer. This is effective to thicken part of the film thickness to allow for a large current flow as in a known semiconductor device (JP-A 2003-151982, paragraph 0011, FIG. 1). The height of a wire may be increased partly to allow for a large current flow as in another known semiconductor device (JP-A8-46049, paragraph 0010, FIG. 1). The semiconductor devices disclosed in the above-described Patent Documents 1, 2, however, are not given any considerations about the problem associated with partial concentration of the current density when a plurality of semiconductor elements are connected in parallel.

SUMMARY OF THE INVENTION

In a first aspect the present invention provides a semiconductor device, comprising: a plurality of semiconductor elements; and a first wire and a second wire provided to connect the semiconductor elements in parallel, wherein the first wire and the second wire include respective wires formed in multiple wiring layers, wherein each wiring layer includes the first wire and the second wire formed alternately and in parallel, wherein the wires are formed as to intersect each other in adjacent wiring layers, and the first wires are connected with each other through a via-connection at an intersection of the first wires and the second wires are connected with each other through a via-connection at an intersection of the second wires.

In a second aspect the present invention provides a semiconductor device, comprising: a plurality of semiconductor elements; and a first wire and a second wire provided to connect the semiconductor elements in parallel, wherein the first wire and the second wire include respective wires formed in multiple wiring layers, wherein each wiring layer includes the first wire and the second wire formed alternately and in parallel, wherein the wires are formed as to intersect each other in adjacent wiring layers, and the first wires are connected with each other through a via-connection at an intersection of the first wires and the second wires are connected with each other through a via-connection at an intersection of the second wires, wherein the wiring layers include at least three layers, with the wires in the second and higher layers being formed wider than the wire in the first layer directly connected to the semiconductor device.

In a third aspect the present invention provides a semiconductor device, comprising: a semiconductor element group including a plurality of semiconductor elements each having first and second impurity-diffused layers serving as first and second main current terminals formed in a semiconductor substrate and a control electrode formed across the diffused layers via an insulator, the plurality of semiconductor elements being formed such that a first diffused region extending in a straight line connecting the first impurity-diffused layers and a second diffused region extending in a straight line connecting the second impurity-diffused layers are arranged in parallel and alternately; a first wire connected to the first diffused region in the semiconductor element group; and a second wire connected to the second diffused region in the semiconductor element group, wherein the first wire and the second wire include respective wires formed in multiple wiring layers, wherein each wiring layer includes the first wire and the second wire formed alternately and in parallel, wherein in the first wiring layer directly connected to the first and second diffused regions, the first wire and the second wire extend along the first diffused region and the second diffused region, respectively, wherein the wires are formed as to intersect each other in adjacent wiring layers, and the first wires are connected with each other through a via-connection at an intersection of the first wires and the second wires are connected with each other through a via-connection at an intersection of the second wires, wherein the plurality of wiring layers include wires in the second and higher layers formed wider than the wire in the first layer.

BRIEF DESCRIPTION OF THE DRAWINGS

FIG. 1 shows brief plan views of a semiconductor device according to a first embodiment of the present invention, in which

DETAILED DESCRIPTION OF THE INVENTION

The present invention will now be described in embodiments below with reference to the drawings.

Figure 1A:
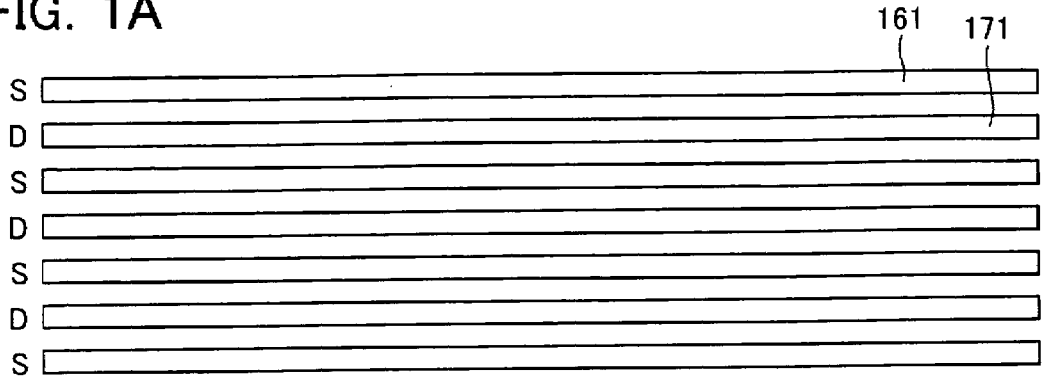
FIG. 1A is illustrative of wires in a first layer.
Figure 1B:
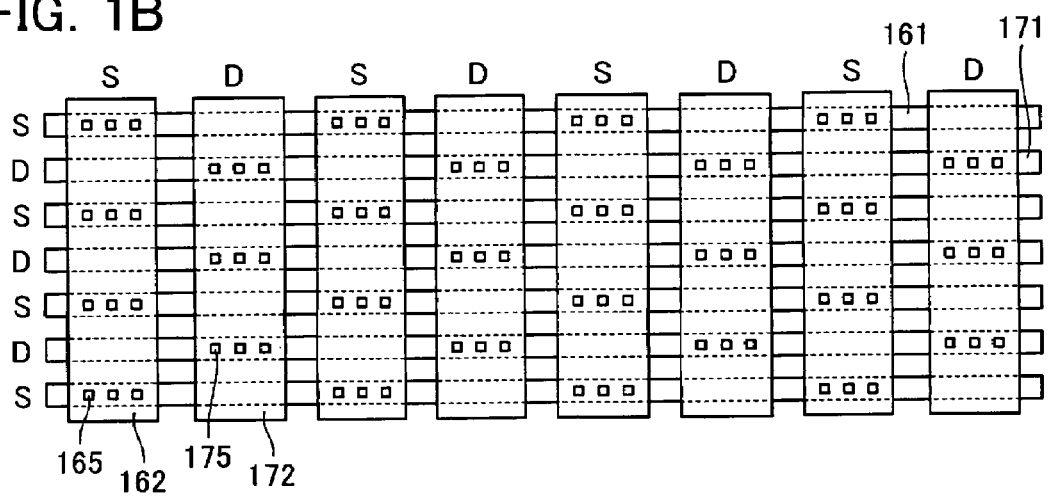
FIG. 1B is illustrative of wires in the first and second layers.
Figure 1C:
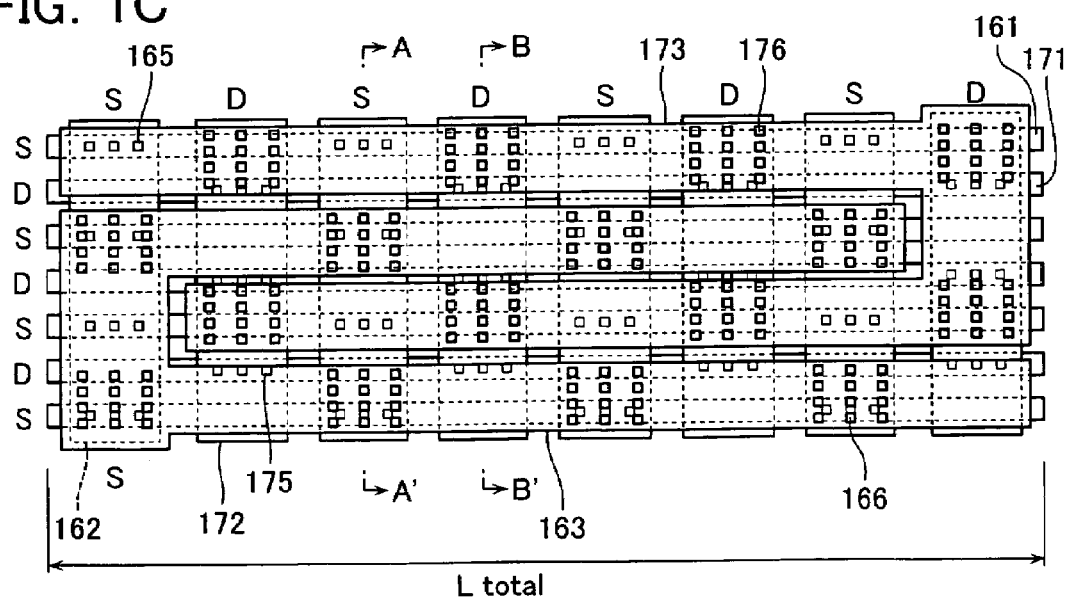
FIG. 1C is illustrative of wires in the first through third layers.
Figure 2:
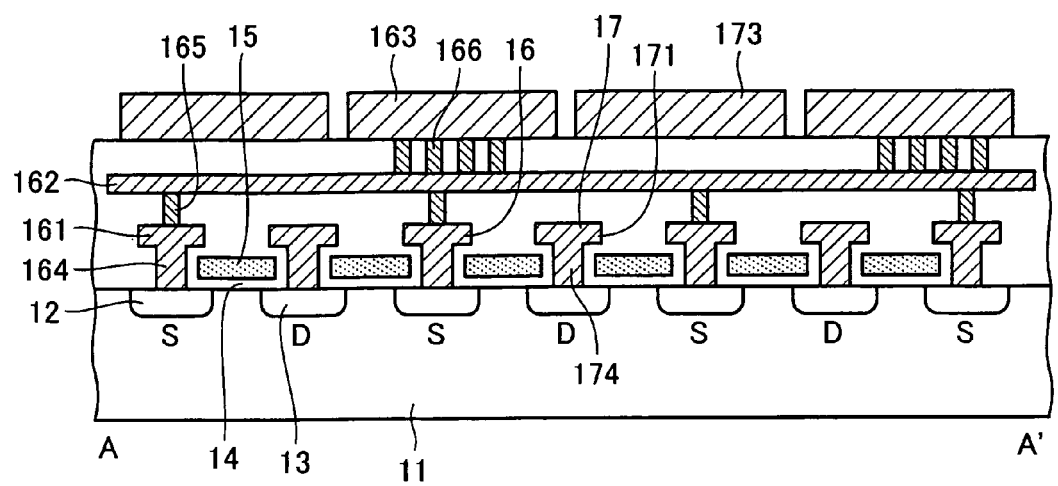
FIG. 2 is a cross-sectional view of the semiconductor device taken along A-A' in FIG. 1.
Figure 3:
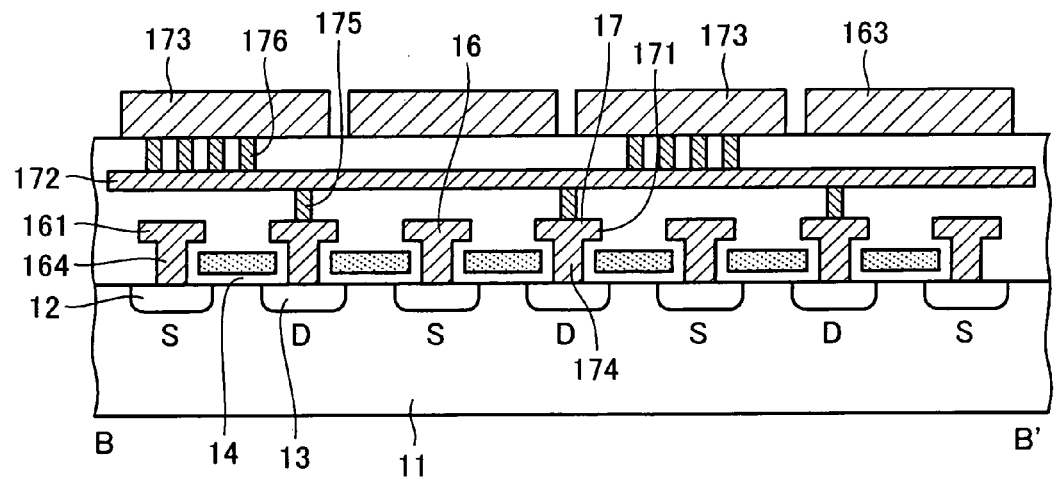
FIG. 3 is a cross-sectional view of the semiconductor device taken along B-B' in FIG. 1.

FIGS. 1-3 show a brief configuration of a semiconductor device according to a first embodiment of the present invention: FIG. 1 shows plan views in order of process step, and FIGS. 2 and 3 show cross-sectional views taken along A-A' and B-B' in FIG. 1C.

As shown in FIGS. 2 and 3, a semiconductor element, or a MOSFET, comprises a semiconductor substrate 11, in which impurity-diffused layers 12, 13 are formed in the shape of straight lines alternately and in parallel as first and second main current terminals, or a source and a drain. On an insulator 14 above the semiconductor substrate 11, a gate electrode 15 is formed across both the diffused layers 12, 13. The diffused layers 12, 13 are connected to other elements through a first, source wire 16 and a second, drain wire 17, respectively. The first wire 16 and the second wire 17 are formed of a metal such as Al and Cu and, in this example, include respective multi-layered wires across three layers.

The first wire 161 and the second wire 171 in the first layer are arranged along the impurity-diffused layers 12, 13, as also shown in FIG. 1A, such as to be connected with the impurity-diffused layers 12, 13 via connections 164, 174, and formed in parallel and alternately.

The first wires 162, 172 in the second layer extend in a direction orthogonal to the first wire 161 and the second wire 171 in the first layer, as shown in FIG. 1B, and are formed in parallel with each other and alternately. The first wires 161, 162 in the first and second layers intersect each other at an intersection, through which a through-hole 165 is formed for via-connecting both the wires 161, 162. The second wires 171, 172 in the first and second layers intersect each other at an intersection, through which a through-hole 175 is formed for via-connecting both the wires 171, 172. As a result, the through-hole 165 and the through-hole 175 have mutual positions shifted by half an arrangement pitch thereof (mutual two-dimensional spatial phases shifted by 180° relative to two orthogonal axes) such that they are dispersed as arranged in a checker pattern.

The first wire 163 and the second wire 173 in the third layer comprise alternately arranged respective two portions, which are orthogonal to the first wire 162 and the second wire 172 in the second layer, that is, in parallel with the first wire 161 and the second wire 171 in the first layer, and formed wider than these wires 161 and 171 as shown in FIG. 1C. The portions of the first wire 163, as well as those of the second wire 173, are connected with each other at both ends to form a pair of C-shaped electrodes interleaved as a whole. The second wires 162, 163 in the second and third layers intersect each other at an intersection, through which a through-hole 166 is formed for via-connecting both the wires 162, 163. The second wires 172, 173 in the second and third layers intersect each other at an intersection, through which a through-hole 176 is formed for via-connecting both the wires 172, 173. As a result, the through-hole 166 and the through-hole 176 have mutual positions shifted by half an arrangement pitch thereof (mutual two-dimensional spatial phases shifted by 180° relative to two orthogonal axes) such that they are dispersed as arranged in a checker pattern. The wires 163, 173 in the third layer can function as an extraction electrode to outside the semiconductor device. Alternatively an extraction electrode can be figured on the wires 163, 173 in the third layer.

The following description is given to the current flowing in the semiconductor device of the embodiment thus configured.

Figure 4:
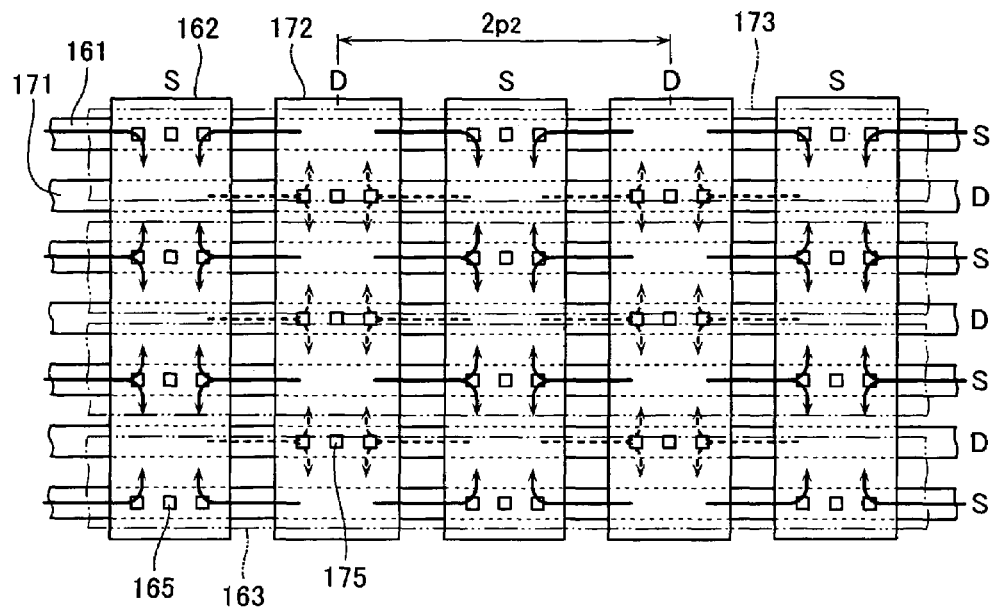
FIG. 4 is an illustrative view of current flowing across the wires in the first and second layers of the semiconductor device.

As shown in FIG. 4, the wires 162, 172 in the second layer have a wiring pitch, $p_2$ (μm), and the current flowing in the element per unit length (1 μm) is represented by $i_{(1\,\mu m)}$. In this case, the wires 161, 171 in the first layer are connected per $2p_2$ to the wires 162, 172 in the second layer via the through-holes 165, 175. Accordingly, the current flowing in the wires 161, 171 in the first layer is represented by:

$$p_2 \cdot i_{(1\,\mu m)} \quad (1)$$

In the through-holes 165, 175, current from or to both sides of the wires 161, 171 flows. Accordingly, the current flowing in the through-holes 165, 175 is represented by:

$$2p_2 \cdot i_{(1\,\mu m)} \quad (2)$$

Figure 5:
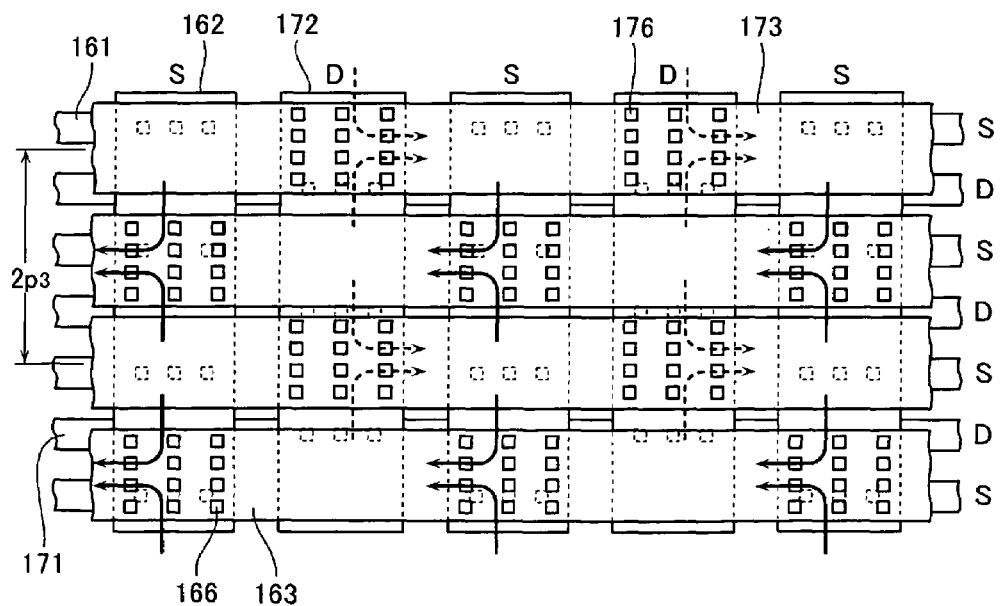
FIG. 5 is an illustrative view of current flowing across the wires in the second and third layers of the semiconductor device.

Similarly, as shown in FIG. 5, the wires 163, 173 in the third layer have a wiring pitch, $p_3$ (μm). In this case, the wires 162, 172 in the second layer are connected per $2p_3$ to the wires 163, 173 in the third layer via the through-holes 166, 176. Accordingly, the current flowing in the wires 162, 172 in the second layer is represented by:

$$2p_2 \cdot p_3 \cdot i_{(1\,\mu m)} \quad (3)$$

Accordingly, the current flowing in the through-holes 166, 176 is represented by:

$$4p_2 \cdot p_3 \cdot i_{(1\,\mu m)} \quad (4)$$

When $L_{total}$ denotes a total length in the wire stretching direction of an effective portion of the elements which are connected to one wire in the first layer, and the wires 163, 173 in the third layer are formed across the total length of the elements as same as the first layer, the through-holes 166, 176 are formed beneath one of the wires 163, 173 in the third layer by the number equal to $L_{total}/2p_2$. The current, $4p_2 \cdot p_3 \cdot i_{(1\,\mu m)}$, flows in the $L_{total}/2p_2$ through-holes 166, 176. Accordingly, the current flowing in one of the wires 163, 173 in the third layer is represented by:

$$2p_3 \cdot L_{total} \cdot i_{(1\,\mu m)} \quad (5)$$

In a word, the current flowing in one of the wires 163, 173 in the third layer is dependent not on the pitch $p_2$ of the wires 162, 172 in the second layer but only on the pitch $p_3$ of the wires 163, 173 in the third layer.

The current density in each layer is described next.

When the wires 161, 171 in the first layer have a wire width, $w_1$, and a thickness, $t_1$, the current density in the wires 161, 171 is represented by:

$$p_2 \cdot i_{(1\,\mu m)}/(w_1 \cdot t_1) \quad (6)$$

When an EM (Electro-Migration) tolerance in a metal or other material which forms the wires 161, 171 in the first layer denotes $j_{1EM}(max)$ [mA/μm²] and the current density is set within a range below the EM tolerance, the pitch $p_2$ of the wires 162, 172 in the second layer is determined to satisfy:

$$j_{1EM}(\max) \geq p_2 \cdot i_{(1\,\mu m)}/(w_1 \cdot t_1)$$

$$p_2 \leq j_{1EM}(\max) \cdot w_1 \cdot t_1/i_{(1\,\mu m)} \quad (7)$$

Figure 6:
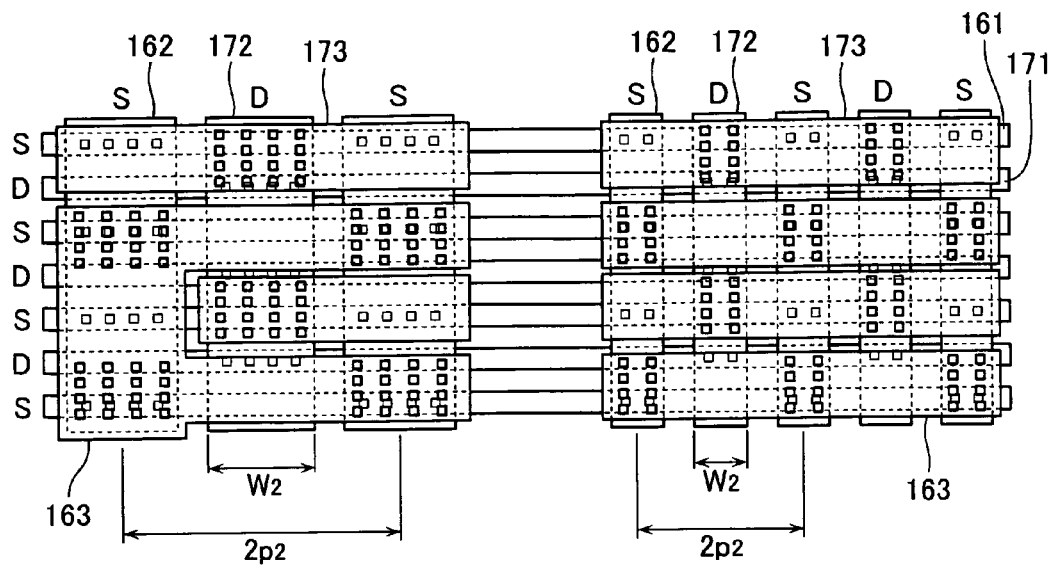
FIG. 6 is an illustrative view of a relation between the width of the wire and the current density in the second layer of the semiconductor device.

As for the wires 162, 172 in the second layer, the current density is kept almost constant regardless of the wire width, $w_2$. In a word, the current flowing in the wires 162, 172 has a value of $2p_2 \cdot p_3 \cdot i_{(1\,\mu m)}$ as represented by the equation (3). A space between wires is generally designed as short as possible in a large-current drive element. Therefore, if the space can be neglected, the current density is given as:

$$2p_2 \cdot p_3 \cdot i_{(1\,\mu m)}/(w_2 \cdot t_2) \approx 2p_3 \cdot i_{(1\,\mu m)}/t_2 \quad (8)$$

which is hardly dependent on the wire width. In a word, as shown in FIG. 6, when the wire width $w_2$ in the second layer is multiplied by n, the current carried in the wire is also multiplied by n and thus the resultant current density is unchanged.

When the wires 163, 173 in the third layer have a wire width, $w_3$, and a thickness, $t_3$, the current density in the wires 163, 173 is represented by:

$$2p_3 \cdot L_{total}/(w_3 \cdot t_3) \cdot i_{(1\,\mu m)} \approx 2L_{total}/t_3 \cdot i_{(1\,\mu m)} \quad (9)$$

When the wire material for use in the wires 163, 173 in the third layer has an EM tolerance of $j_{3EM}(\max)$ [mA/μm²], it is required to set $L_{total}$ within a range that the current density in the wires 163, 173 in the third layer does not exceed the EM tolerance. Accordingly, the total length $L_{total}$ of the element may be set to have an appropriate value to satisfy:

$$j_{3EM}(\max) \geq 2L_{total}/t_3 \cdot i_{(1\,\mu m)}$$

$$L_{total} \leq j_{3EM}(\max) \cdot t_3 \cdot i_{(1\,\mu m)}/2 \quad (10)$$

In this embodiment, the wires in adjacent layers intersect each other at right angles, and the through-holes are provided through the intersections such that via-connections for connecting the upper and lower wiring layers are dispersed as arranged two-dimensionally, for example, in a checker pattern. This is effective to avoid partial concentration of current. In addition, the pitch $p_2$ of the wires 162, 172 in the second layer and the total length $L_{total}$ of the element are respectively set appropriately to form the wires in the first and third layers within a range below the EM tolerance.

Figure 7:
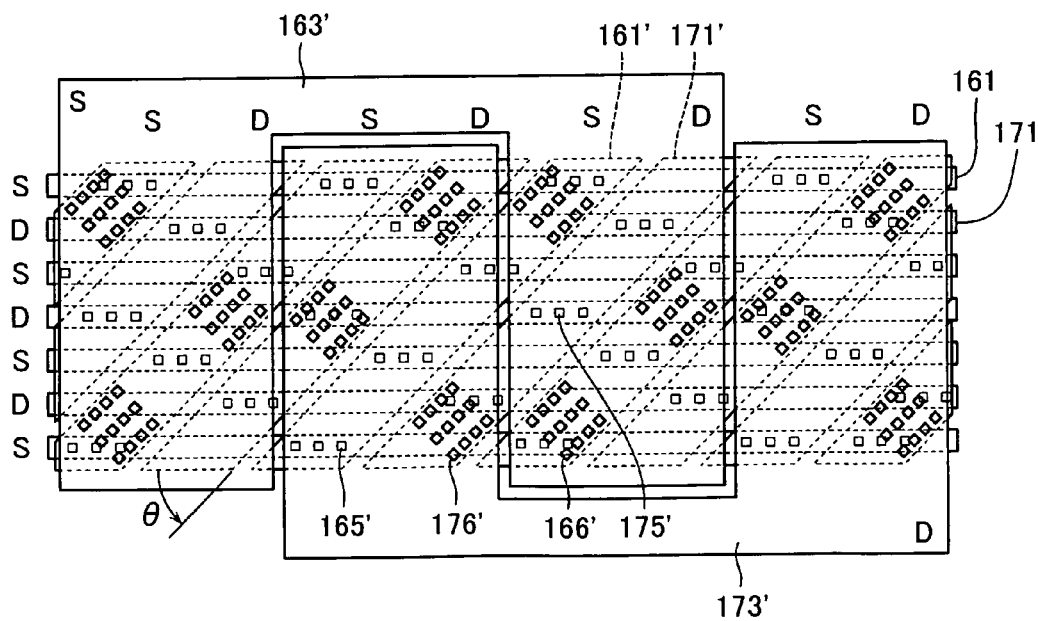
FIG. 7 is a brief plan view of a semiconductor device according to a second embodiment of the present invention.
Figure 8:
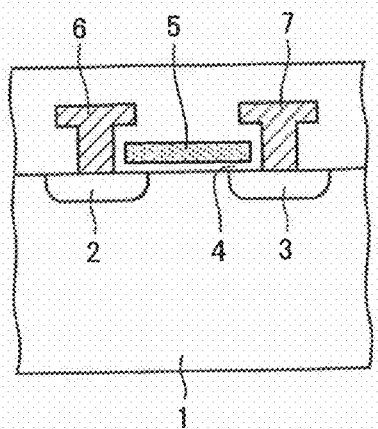
FIG. 8 is a cross-sectional view showing a structure of a general MOSFET.
Figure 9:
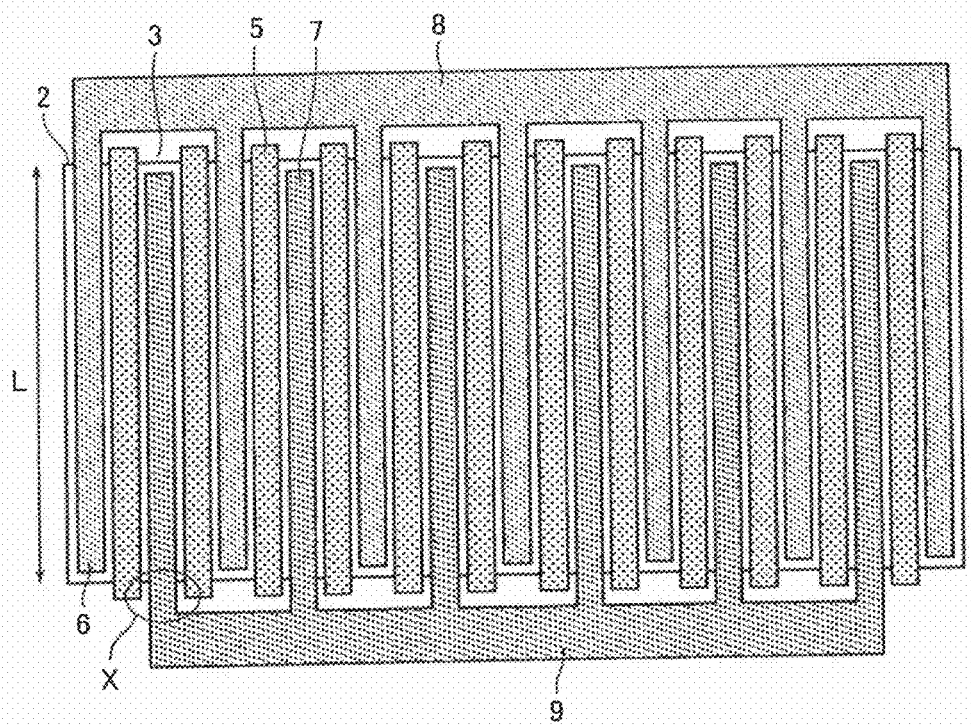
FIG. 9 is a plan view showing an electrode wiring structure when conventional MOSFETs are connected in parallel.

FIG. 7 is a partial plan view of a semiconductor device according to a second embodiment of the present invention.

In this embodiment, wires 162', 172' in the second layer obliquely intersect the wires 161, 171 in the first layer at an angle of θ, and wires 163', 173' in the third layer obliquely intersect the wires 162', 172' in the second layer at an angle of (90°−θ). As a result, the wires 161, 171 in the first layer and the wires 163', 173' in the third layer may have a relation to intersect each other at right angles. In a word, the use of a slanting wiring technology makes it possible to arrange the direction of wiring the wire in the third layer arbitrarily relative to the direction of wiring the wire in the first layer.

Also in such the embodiment, through-holes 165', 175' for connecting the wires 161, 171 in the first layer with the wires 162', 172' in the second layer, and through-holes 166', 176' for connecting the wires 162', 172' in the second layer with the wires 163', 173' in the third layer can be dispersed as arranged two-dimensionally. This is effective to avoid concentration of current in the wire.

The present invention is not limited to the above-described embodiments.

In the above embodiments the wiring layers include three layers though the wiring layers may include four layers or more. Further, respective wire or at least one wire in each wiring layer can be composed by stacked two wires. For example, the wires 161, 171 in the first layer can be composed by stacked two wires, or the wires 162, 172 in the second layer can be composed by stacked two wires. This makes it possible to relieve the current density of the current flowing in these wires to ½.

In the above embodiments the MOSFET is exemplified though the present invention is similarly applicable to wiring structures in bipolar transistors, IGBTs, and diodes as well, needless to say.

What is claimed is:

1. A semiconductor device, comprising;
a plurality of semiconductor elements; and
a first wire and a second wire provided to connect said semiconductor elements in parallel,
wherein said first wire and said second wire include respective wires in multiple wiring layers,
wherein each wiring layer includes said first wire and said second wire arranged alternately and in parallel,
wherein said wires intersect each other in adjacent wiring layers, and said first wires are connected with each other through a via-connection at an intersection of said first wires and said second wires are connected with each other through a via-connection at an intersection of said second wires,
and wherein when $L_{total}$ denotes a total length in a wire stretching direction of an effective portion of the elements, the total length $L_{total}$ of the elements is set to have a value of:
$L_{total} \leq j_{EM}(\max) \cdot t \cdot i_{(\mu m)}/2$, where t denotes a thickness of the wires in a highest wiring layer, $i_{(\mu m)}$ denotes a current flowing in the elements per unit length (1 μm) and $j_{EM}(\max)$ denotes an Electro-Migration tolerance of a material of the wires in the highest wiring layer.

2. The semiconductor device according to claim 1,
wherein said each semiconductor element comprises a first electrode region and a second electrode region, and provides a current between said first electrode region and said second electrode region,
wherein said first wires are connected with said first electrode regions of said semiconductor elements respectively,
wherein said second wires are connected with said second electrode regions of said semiconductor elements respectively,
and wherein said semiconductor elements are connected in parallel by said first wires and said second wires.

3. The semiconductor device according to claim 2,
wherein said semiconductor elements are MOSFETs,
wherein said first electrode region is a source region,
and wherein said second electrode region is a drain region.

4. The semiconductor device according to claim 2,
wherein said semiconductor elements are bipolar transistors,
wherein said first electrode region is a emitter region,
and wherein said second electrode region is a collector region.

5. The semiconductor device according to claim 2,
wherein said semiconductor elements are IGBTs,
wherein said first electrode region is a emitter region,
and wherein said second electrode region is a collector region.

6. The semiconductor device according to claim 2,
wherein said semiconductor elements are diodes,
wherein said first electrode region is an anode region,
and wherein said second electrode region is a cathode region.

7. The semiconductor device according to claim 2,
wherein said intersection of said first wires and said intersection of said second wires are dispersed as arranged two-dimensionally such that mutual positions thereof are shifted by half an arrangement pitch thereof.

8. The semiconductor device according to claim 2,
wherein said wires are arranged as to intersect each other at right angles in adjacent wiring layers.

9. The semiconductor device according to claim 2,
wherein said wiring layers include at least three layers, the wires in a second and higher layers are wider than the wires in a first layer directly connected to said semiconductor elements.

10. The semiconductor device according to claim 2,
wherein at least one layer of said wiring layers is stacked in two wires.

11. The semiconductor device according to claim 2,
wherein an uppermost layer of said wiring layers is an extraction electrode to outside the semiconductor device.

12. The semiconductor device according to claim 2 further comprising:
a first extraction electrode formed on said first wire of an uppermost layer of said wiring layers,
a second extraction electrode formed on said second wire of said uppermost layer of said wiring layers,
wherein said first extraction electrode is connected with said first wire of said uppermost layer,
and wherein said second extraction electrode is connected with said second wire of said uppermost layer.

13. A semiconductor device, comprising:
a plurality of semiconductor elements; and
a first wire and a second wire provided to connect said semiconductor elements in parallel,
wherein said first wire and said second wire include respective wires in multiple wiring layers,
wherein each wiring layer includes said first wire and said second wire arranged alternately and in parallel,
wherein said wires intersect each other in adjacent wiring layers, and said first wires are connected with each other through a via-connection at an intersection of said first wires and said second wires are connected with each other through a via-connection at an intersection of said second wires,
wherein said wiring layers include at least three layers, with the wires in a second and higher layers being wider than the wires in a first layer directly connected to said semiconductor elements,
and wherein when $L_{total}$ denotes a total length in a wire stretching direction of an effective portion of the elements, the total length $L_{total}$ of the elements is set to have a value of:
$L_{total} \leq j_{EM}(\max) \cdot t \cdot i(\mu m)/2$, where t denotes a thickness of the wires in a highest wiring layer, $i(\mu m)$ denotes a current flowing in the elements per unit length (1 μm) and $j_{EM}(\max)$ denotes an Electro-Migration tolerance of a material of the wires in a highest layer.

14. The semiconductor device according to claim 13,
wherein said each semiconductor elements comprises a first electrode region and a second electrode region, and provides a current between said first electrode region and said second electrode region,
wherein said first wires are connected with said first electrode region of said semiconductor elements respectively,
wherein said second wires are connected with said second electrode region of said semiconductor elements respectively,
and wherein said semiconductor elements are connected in parallel by said first wires and said second wires.

15. The semiconductor device according to claim 13,
wherein said intersection of said first wires and said intersection of said second wires are dispersed as arranged two-dimensionally such that mutual positions thereof are shifted by half an arrangement pitch thereof.

16. The semiconductor device according to claim 13,
wherein said wires are arranged as to intersect each other at right angles in adjacent wiring layers.

17. A semiconductor device, comprising:
a semiconductor element group including a plurality of semiconductor elements each having first and second impurity-diffused layers serving as first and second main current terminals formed in a semiconductor substrate and a control electrode formed across said diffused layers via an insulator, said plurality of semiconductor elements being formed such that a first diffused region extending in a straight line connecting said first impurity-diffused layers and a second diffused region extending in a straight line connecting said second impurity-diffused layers are arranged in parallel and alternately;
a first wire connected to said first diffused region in said semiconductor element group; and
a second wire connected to said second diffused region in said semiconductor element group,
wherein said first wire and said second wire include respective wires in multiple wiring layers,
wherein each wiring layer includes said first wire and said second wire arranged alternately and in parallel,
wherein in a first wiring layer directly connected to said first and second diffused regions, said first wire and said second wire extend along said first diffused region and said second diffused region, respectively,
wherein said wires intersect each other in adjacent wiring layers, and said first wires are connected with each other through a via-connection at an intersection of said first wires and said second wires are connected with each other through a via-connection at an intersection of said second wires,
wherein said plurality of wiring layers include wires in a second and higher layers wider than the wire in said first layer,
and wherein when $L_{total}$ denotes a total length in a wire stretching direction of an effective portion of the elements, the total length $L_{total}$ of the element is set to have a value of:
$L_{total} \leq j_{EM}(\max) \cdot t \cdot i(\mu m)/2$, where t denotes a thickness of the wires in a highest wiring layer, $i(\mu m)$ denotes a current flowing in the elements per unit length (1 μm) and $j_{EM}(\max)$ denotes an Electro-Migration tolerance of a material of the wires in the highest wiring layer.

18. The semiconductor device according to claim 17,
wherein said intersection of said first wires and said intersection of said second wires are dispersed as arranged two-dimensionally such that mutual positions thereof are shifted by half an arrangement pitch thereof.

19. The semiconductor device according to claim 17,
wherein said wires are arranged as to intersect each other at right angles in adjacent wiring layers.

* * * * *